(12) United States Patent
Gupta et al.

(10) Patent No.: US 11,079,824 B2
(45) Date of Patent: Aug. 3, 2021

(54) CURRENT DISTRIBUTION FROM DIFFERENT POWER SOURCES

(71) Applicant: SanDisk Technologies LLC, Plano, TX (US)

(72) Inventors: Nitin Gupta, San Jose, CA (US); Bhavin Odedara, San Jose, CA (US); Raghu Voleti, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 242 days.

(21) Appl. No.: 16/390,821

(22) Filed: Apr. 22, 2019

(65) Prior Publication Data
US 2020/0333864 A1  Oct. 22, 2020

(51) Int. Cl.
| | |
|---|---|
| *G06F 1/00* | (2006.01) |
| *G06F 11/30* | (2006.01) |
| *G06F 1/28* | (2006.01) |
| *G05F 1/46* | (2006.01) |
| *G01R 19/165* | (2006.01) |

(52) U.S. Cl.
CPC .......... *G06F 1/28* (2013.01); *G01R 19/16519* (2013.01); *G05F 1/462* (2013.01)

(58) Field of Classification Search
CPC .......... G06F 1/28; G06F 1/266; G06F 1/3206; G06F 1/3296; G06F 19/16519; G05F 1/462
See application file for complete search history.

(56) References Cited

U.S. PATENT DOCUMENTS

| | | | | |
|---|---|---|---|---|
| 5,262,712 A | * | 11/1993 | Klotzig | G05F 1/563 |
| | | | | 323/224 |
| 6,479,972 B1 | * | 11/2002 | Chen | G05F 1/465 |
| | | | | 323/266 |
| 6,707,280 B1 | * | 3/2004 | Liu | G05F 1/618 |
| | | | | 323/224 |
| 2009/0079264 A1 | * | 3/2009 | Minami | G06F 1/266 |
| | | | | 307/44 |
| 2012/0011376 A1 | * | 1/2012 | Zai | G06F 1/266 |
| | | | | 713/300 |
| 2017/0185125 A1 | * | 6/2017 | Lin | G06F 1/266 |

* cited by examiner

*Primary Examiner* — Nitin C Patel
(74) *Attorney, Agent, or Firm* — Vierra Magen Marcus LLP

(57) ABSTRACT

Systems and methods for power distribution are disclosed. A system includes a first power domain that supplies current to an integrated circuit at a first voltage level, a second power domain that supplies current to the integrated circuit at a second voltage level, and a current distribution component that is connected to the first power domain and connectable to the second power domain and senses a metric comprising a first current level or a first voltage level drawn from the first power domain, determines whether the metric exceeds a first threshold, and in response to determining that the metric exceeds the first threshold, electrically connects the second power domain to the integrated circuit to supply additional current such that an aggregate current level received by the integrated circuit comprises current from the first power domain and the additional current from the second power domain.

14 Claims, 11 Drawing Sheets

CURRENT DISTRIBUTION FROM DIFFERENT POWER SOURCES

TECHNICAL FIELD

The present disclosure, in various embodiments, relates to electronic devices and more particularly, to distributing power within an electrical device.

BACKGROUND

A voltage regulator for an integrated circuit may, in some examples, be fixed or hard-wired. The selection of an input power source may be based on a worst consumption load on the regulator (e.g., according to a highest voltage needed by components of the integrated circuit). In this example, various components of the integrated circuit that require a voltage level that is lower than the input power source waste current and generate excess heat resulting in thermal degradation. Thus, managing a power supply for an integrated circuit that includes components operating at varying voltage levels is difficult.

SUMMARY

Systems, apparatuses and methods are presented for power distribution. A system includes a first power domain that supplies current to an integrated circuit at a first voltage level, a second power domain that supplies current to the integrated circuit at a second voltage level that is higher than the first voltage level. The system may further include a current distribution component that is connected to the first power domain and connectable to the second power domain, senses a metric comprising a first current level or a first voltage level drawn from the first power domain, determines whether the metric exceeds a first threshold, and in response to determining that the metric exceeds the first threshold, electrically connects the second power domain to the integrated circuit to supply additional current such that an aggregate current level received by the integrated circuit comprises current from the first power domain and the additional current from the second power domain.

In another exemplary embodiment, the metric is the first current level and the current distribution component senses the first current level using a sense MOSFET and a first main power MOSFET that is sized to generate a corresponding threshold voltage in response to the first power domain supplying current above the first threshold.

In one exemplary embodiment, electrically connecting the second power domain to the integrated circuit includes connecting the first main power MOSFET to a second main power MOSFET in the second power domain to supply the additional current.

In another exemplary embodiment, the die includes a plurality of additional power domains, wherein the current distribution circuitry is configured to connect respective ones of the additional power domains in response to a system metric falling with a predetermined range associated with each of the respective additional power domains.

In one exemplary embodiment, a number of the plurality of resistors are connected according to a differential voltage between the metric and a reference voltage.

In another exemplary embodiment, the system further includes a plurality of additional power domains, wherein the current distribution component is configured to connect respective ones of the additional power domains in response to a system metric falling with a predetermined range associated with each of the respective additional power domains.

In one exemplary embodiment, the aggregate current comprises a maximum amount of current available from the first domain.

In another exemplary embodiment, a die includes memory circuitry, a first power circuit that supplies current to the memory circuitry at a first voltage level, a second power circuit that supplies current to the memory circuitry at a second voltage level that is higher than the first voltage level, and current distribution circuitry that is connected to the first power circuit and connectable to the second power circuit. In another example embodiment, the current distribution circuitry senses a metric comprising a first current level or a first voltage level drawn from the first power circuit, determines whether the metric exceeds a first threshold, and in response to determining that the metric exceeds the first threshold, electrically connects the second power circuit to the memory circuitry to supply additional current such that an aggregate current level received by the memory circuitry comprises current from the first power circuit and the additional current from the second power circuit.

In one exemplary embodiment, the metric includes the first current level and the current distribution circuitry includes a sense MOSFET that senses the first current level, and a first main power MOSFET sized to generate a corresponding threshold voltage in response to the first current level exceeding the first threshold.

In another exemplary embodiment, electrically connecting the second power circuit to the memory circuitry comprises connecting the first main power MOSFET to a second main power MOSFET in the second power circuit to supply the additional current.

In one exemplary embodiment, the current distribution circuitry is further configured to connect a plurality of resistors to scale the additional current supplied by the second power circuit according to the metric.

In another exemplary embodiment, a number of the plurality of resistors are connected according to a differential voltage between the metric and a reference voltage.

In one exemplary embodiment, the die further includes a plurality of additional power domains, wherein the current distribution component is configured to connect respective ones of the additional power domains in response to a system metric falling with a predetermined range associated with each of the respective additional power domains.

In another exemplary embodiment, the aggregate current comprises a maximum amount of current available from the first circuit.

In one exemplary embodiment, a method includes sensing a metric comprising one of a first current level and a first voltage level drawn by an integrated circuit device from a first power domain, determining that the metric exceeds a threshold, electrically connecting a second power domain, at a second voltage level that is higher than the first voltage level, after determining that the metric exceeds the threshold, and concurrently supplying the first current level and additional current from the second power domain to the integrated circuit device.

In another exemplary embodiment, sensing the metric includes sensing the first current level using a sense MOSFET and a first main power MOSFET sized to generate a corresponding threshold voltage in response to the first power domain supplying current above the threshold.

In one exemplary embodiment, electrically connecting the second power domain to the integrated circuit comprises connecting the first main power MOSFET to a second main power MOSFET in the second power domain to supply the additional current.

In another exemplary embodiment, electrically connecting the second power domain comprises connecting a plurality of resistors to scale the additional current supplied by the second power domain according to the metric.

In one exemplary embodiment, the method further includes connecting a plurality of additional power domains in response to a system metric falling with a predetermined range associated with each of the respective additional power domains.

In another exemplary embodiment, the aggregate current level received by the integrated circuit device comprises a maximum amount of current available from the first domain.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope; the disclosure is described and explained with additional specificity and detail through the use of the accompanying drawings, in which.

DETAILED DESCRIPTION

Figure 1:
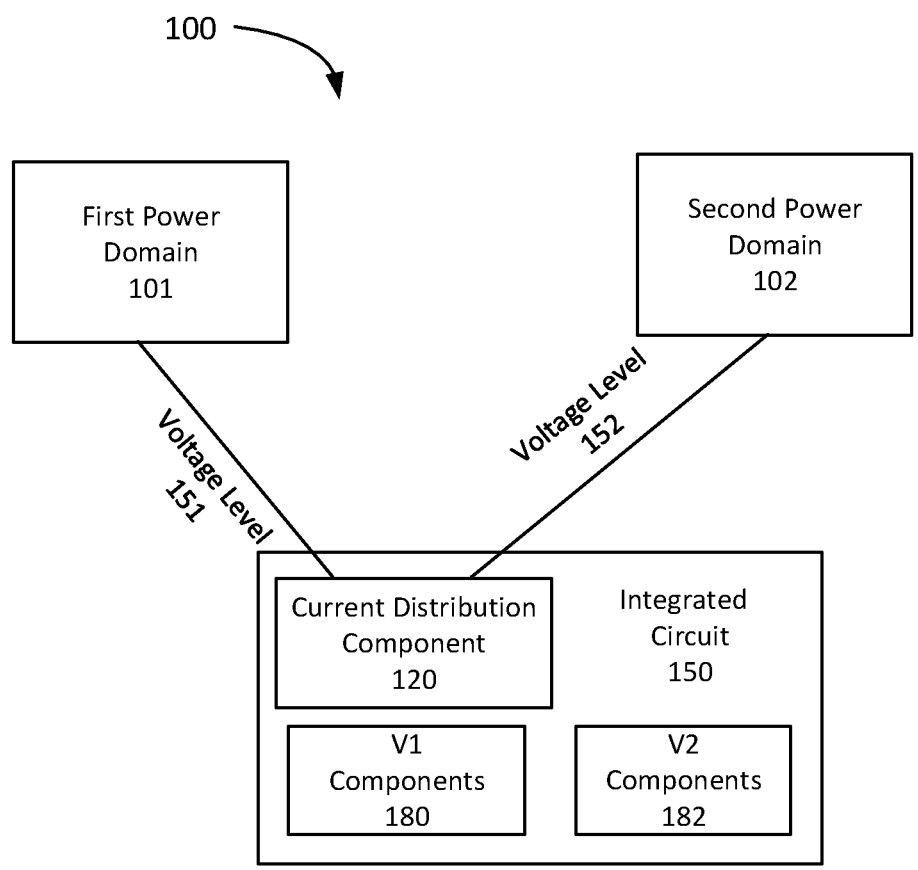
FIG. 1 is an illustration depicting one exemplary embodiment of a power distribution system.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. In one exemplary embodiment, a module is implemented in hardware component that are not field programmable (e.g., resistors, capacitors, comparators, MOSFET's, etc.). In another exemplary embodiment, a module is implemented in programmable hardware devices such as field programmable gate arrays, programmable array logic, programmable logic devices, other firmware, or the like.

As used herein, "firmware" means software instructions that provide low-level control for a device's hardware. Firmware may provide a standardized operating environment for a device's more complex software, or may perform all of the functions of an integrated circuit. In certain embodiments, firmware is stored in non-volatile memory storage such as, ROM, EPROM, flash memory, or the like. In some embodiments, firmware is permanently installed and cannot be changed after manufacture. In other exemplary embodiments, firmware may be reprogrammed through one or more procedures provided by the manufacturer of the firmware.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits, off-the-shelf semiconductors such as logic chips, transistors, or other discrete devices, and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits, off-the-shelf semiconductors such as logic chips, transistors, or other discrete devices, and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

In certain exemplary embodiments, various components of a circuit, such as controllers, memory arrays, chips, etc. draw varying levels of current during their operation. In some examples, processors draw more current when currently performing operations, memory arrays draw more current when storing information, storage devices draw more current while storing information and otherwise draw less current. In other exemplary embodiments, an amount of current drawn by a circuit actively changes according to the current consumption of currently operating components in the circuit. In some examples, the amount of current changes over a period of milliseconds, microseconds, nanoseconds, or faster. Of course, one skilled in the art may recognize how components in a circuit affect an amount of current drawn by the circuit and this disclosure is meant to include all such ways.

As described herein, a power distribution system is sized to accommodate a maximum amount of current drawn by the circuit. In other exemplary embodiments, circuits in different power domains are sized to accommodate a maximum amount of current drawn by each respective power domain. Similarly, a current distribution component of the power distribution systems may receive current from multiple different power domains and may be sized to accommodate an aggregate maximum amount of current that may be supplied by each of the connectable power domains.

Causes of changes in the power consumption of a circuit vary widely. In some exemplary embodiments, changes in resistance, inductance, or other, more complex mechanisms alter an amount of current drawn by the circuit. In another example embodiments, as the circuits initializes (e.g., a voltage is initially applied to the circuit), the current consumption of the circuit may peak until a time when the components of the circuit stabilize.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," "in an exemplary embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

In one example embodiment, a power distribution circuit powers a non-volatile memory device as described herein. A non-volatile memory device may include one or more non-volatile memory elements of non-volatile memory media, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), spin-transfer torque (STT) MRAM, spin orbit torque SOT-MRAM, magnetic storage media (e.g., hard disk, tape), optical storage media, and/or the like. The one or more non-volatile memory elements of non-volatile memory media, in certain embodiments, include storage class memory (SCM). Examples herein refer to NAND memory, or more particularly, SLC NAND memory; however, the systems and methods provided herein may be applied to other memory types, including but not limited to those listed above.

As used herein, "intersecting" comprises two components (e.g., word lines, bit lines, storage cells, etc.) that are physically arranged so that they may electrically affect each other. A word line intersecting with a storage cell means that the word line is electrically connected to the storage cell so that application of a programming voltage to the word line programs the storage cell. In other example embodiment, a first power domain is electrically connected to a second power domain to provide power to an integrated circuit.

As used herein, items described as being "electrically connected" are configured such that an electrical signal can be passed from one item to the other. A passive electrically conductive component physically connected to a passive electrically insulative component (e.g. a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. Directly electrically connected components do not include components electrically connected through active elements, such as transistors or diodes. Directly electrically connected elements may be directly physically connected and directly electrically connected.

FIG. 1 is an illustration depicting one exemplary embodiment of a power distribution system 100. In one example embodiment, the power distribution system 100 includes a first power domain 101 that supplies current to an integrated circuit 150 at a first voltage level 151.

As used herein, a "power domain" is a tangible component that supplies electrical power to an electric load. In certain example embodiments, the electric load is an integrated circuit, a memory device, an array of memory cells, a controller, an electrical device that includes any combination of these elements. In another exemplary embodiment, the power domain converts electric current from a source to a predetermined voltage, current, and/or frequency to power the electric load.

In one exemplary embodiment, the first power domain 101 supplies direct current (DC) at a DC voltage as one skilled in the art may appreciate. In another exemplary embodiment, the first power domain 101 converts power from an A/C power source.

In an exemplary embodiment, the power distribution system 100 includes a second power domain 102 that supplies current to the integrated circuit at a second voltage level 152 that is higher than the first voltage level. In another exemplary embodiment, the second power domain 102 supplies current to the integrated circuit at a second voltage level 152 that is lower than the first voltage level 151.

In one exemplary embodiment, the power distribution system 100 includes a current distribution component 120 that is connected to the first power domain 101 and connectable to the second power domain 102. The current distribution component 120 may be configured to sense an electrical metric of the first power domain 101. In certain example embodiments, the electrical metric is a voltage or a current level drawn from the first power domain 101.

In another exemplary embodiment, the current distribution component 120 determines whether the metric exceeds a first threshold. In one example embodiment, the first threshold is a voltage level and the current distribution component 120 determines whether a voltage level supplied by the first power domain 101 exceeds the first threshold. In another example embodiment, the first threshold is a current level and the current distribution component 120 determines whether a current level supplied by the first power domain 101 exceeds the first threshold.

In one exemplary embodiment, in response to determining that the metric exceeds the first threshold, the current distribution component 120 electrically connects the second power domain 102 to the integrated circuit 150 to supply additional current such that an aggregate current level received by the integrated circuit 150 includes current from the first power domain 101 and the additional current from the second power domain 102.

In one example embodiment, the first metric is 400 milliamps (mA). In response to the current distribution component 120 sensing a current amount from the first power domain 101 above 400 mA, the current distribution component 120 electrically connects the second power domain 102.

In another exemplary embodiment, the integrated circuit 150 includes a plurality of components (V1) 180 that operate on a first voltage level (e.g., 1.8 volts), and a plurality of components (V2) 182 that operate on a second voltage level (e.g., 3.3 volts). Thus, the power distribution system 100 may supply a voltage level of 1.8 volts to power V1 components and in response to V2 components being enabled, the current amount supplied to the integrated circuit 150 increases. In response, the power distribution system 100 electrically connects the second power domain 102 to supply the additional current needed by the V2 components 182.

In an alternate embodiment, the first threshold is dynamically determined. In a first more specific embodiment, the threshold may be dynamically determined based on a current operation of the electronic device. For example, the electronic device may include a plurality of components, each of which require a certain amount of power (or current). The power distribution system 100 may determine which of the plurality of components is currently operating and, based on the determination, calculate a threshold necessary to meet the current operating requirements. More specifically, different components may require different operating voltages to function properly. In one example, a first component may require a 0.9V stable voltage, whereas a second component may require a 1.8V stable voltage. In response to determining that only the second component is operating, the threshold may be dynamically selected such that an interrupt is generated only when the sensed current indicates that at least a 1.8V stable voltage cannot be achieved. In this regard, the threshold may change based on which of the components is currently operating. In a second more specific embodiment, the threshold may be determined based on one or more look-up tables. Upon manufacture, a memory may be programmed with a characteristic of the electronic device. The characteristic may comprise a type of operation (e.g., a "fast" system or a "slow" system) or may comprise a voltage necessary for operation (e.g., 1.8V). Further, a look-up table may correlate characteristics to thresholds. For example, the look-up table may correlate a "fast" system to a first threshold, and a "slow" system to a second threshold. In practice, the monitoring device may access the memory to determine the value of the characteristic (e.g., a "fast" system), and use the value of the characteristic in the look-up table to determine the threshold.

In one exemplary embodiment, the aggregate current supplied by the power distribution system 100 includes a maximum amount of current available from the first power domain 101.

Figure 5:
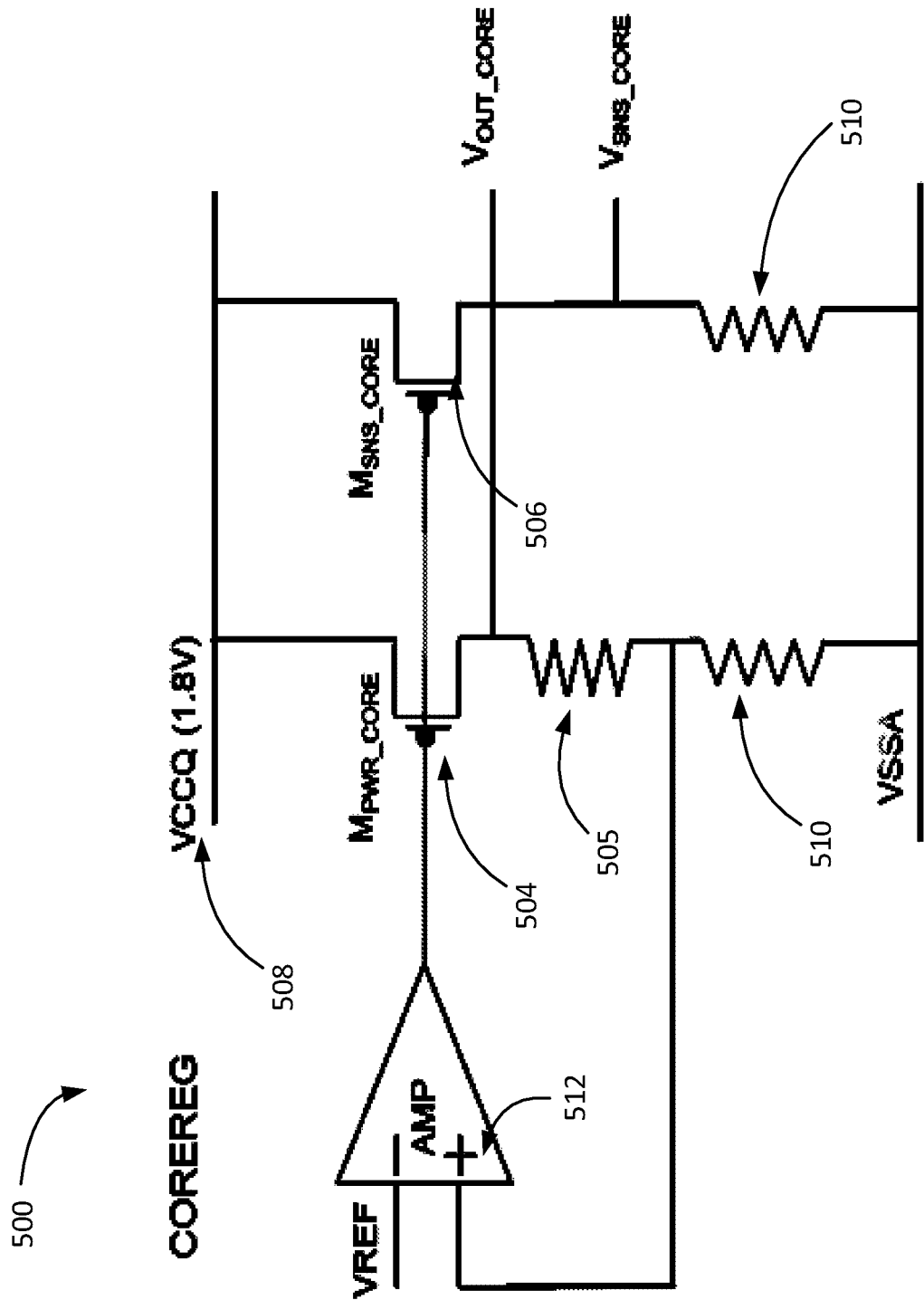
FIG. 5 is an illustration depicting a circuit for a power distribution system according to another exemplary embodiment.

In another exemplary embodiment, a die includes memory circuitry, the first power domain 101, the second power domain 102, and the integrated circuit 150. In this exemplary embodiment, the first power domain is implemented as a first power circuit (e.g., a power circuit as depicted in FIG. 5, 6, or 7) that supplies current to the memory circuitry. Furthermore, the second power domain 102 may be implemented as a power circuit.

Figure 2:
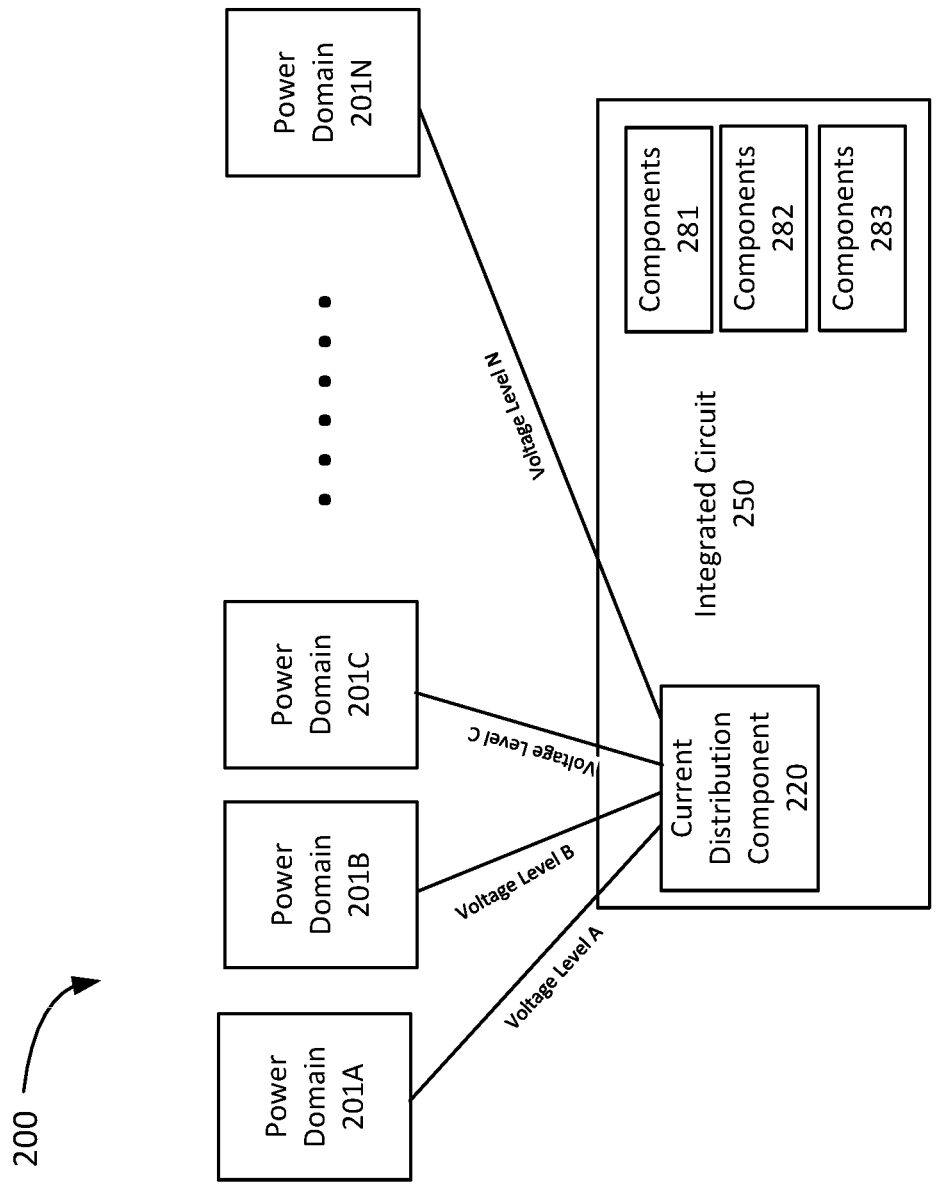
FIG. 2 is an illustration depicting another an exemplary embodiment of a power distribution system.

FIG. 2 is an illustration depicting another an exemplary embodiment of a power distribution system 200. In one example embodiment, the power distribution system 200 includes a plurality of power domains 201 that supply current to an integrated circuit 250 at varying voltage levels as will be described.

In an exemplary embodiment, the power domains 201 are configured to supply current to the integrated circuit 250 at increasingly higher voltage levels. In one exemplary embodiment, the power distribution system 200 includes a current distribution component 220 that is connected to the first power domain 201A and connectable to each of the plurality of power domain 201. The current distribution component 220 may be configured to sense an electrical metric of the power domain 201A. In certain example embodiments, the electrical metric is a voltage or a current level drawn from the power domain 201A.

In another exemplary embodiment, each of the plurality of power domains 201 are associated with predetermined voltage levels and the current distribution component 220 determines whether the metric falls within a voltage range for one of the power domains 201. In one exemplary embodiment, the current distribution component 220 determines a current amount flowing from a power domain 201A.

In one exemplary embodiment, in response to determining that the current amount exceeds the first threshold, the current distribution component 120 electrically connects a second power domain 201B. Furthermore, as a current amount flowing from power domains 201A and 201B exceeds a second threshold current amount, the current distribution component 120 electrically connects a third power domain 201C. As the aggregate amount of current being received by the current distribution component 220 continues to rise, additional power domains are connected (e.g., up to power domain 201N) to supply the additional current.

In another exemplary embodiment, in response to determining that the current amount falls below a threshold current amount for power domain 201N, the current distribution component 220 electrically disconnects the power domain 201N. Therefore, in certain embodiments, the current distribution component 220 may connect and/or disconnect various power domains according to the current needs of the integrated circuit 250.

In one exemplary embodiment, components 281 operate at a first voltage, components 282 operate at a second voltage that is higher than the first voltage, and components 283 operate at a voltage level that is higher than the second voltage level. In this example embodiment, as component 281, 282, 283 are enabled or disabled, the current distribution component 220 connects and/or disconnects various power domains to supply sufficient current to power the components.

In one exemplary embodiment, the current distribution component 220 electrically connects another power domain after a maximum amount of current is supplied by currently connected power domains.

In one example embodiment, predetermined threshold ranges for the plurality of power domains 201 are 200 mA per domain. For example, in response to the first power domain 201A supplying more than 200 mA, the current distribution component 220 electrically connects a second power domain 201B to supply up to 400 mA. In response to the current distribution component 220 sensing more than 400 mA, the current distribution component 220 connects a third power domain 201C, etc.

Furthermore, in response to power domains 201A, 201B, and 201C being connected to the integrated circuit and the current distribution component 220 sensing an aggregate amount of current falling below 400 mA, the current distribution component 220 electrically disconnects the third power domain 201C. In certain embodiments, the power distribution system 200 includes any number of power domains and although the letter 'N' is used to designate a number of power domains, this disclosure is not limited to 13 power domains.

In another exemplary embodiment, and as will be further described, the current distribution component 220 electrically connects power domains 201 by electrically connecting a power MOSFET in each of the respective power domains.

As used herein, a MOSFET is a metal-oxide-semiconductor field-effect transistor that is fabricated by the controlled oxidation of silicon. A MOSFET may have an insulated gate, whose voltage determines the conductivity of the device. Thus, a change in the applied voltage may be used to switch electronic signals. Furthermore, although the 'M' in MOSFET stands for "metal," this is not necessarily the case as the gate material may be a layer of polysilicon. Also, "oxide" is not necessarily restricted by the nature of the word as a wide variety of dielectric materials may be used.

In one exemplary embodiment, the current distribution component 220 is further configured to connect a plurality of resistors between a power domain 201 and the integrated circuit 250 to scale the additional current supplied by the power domain. In one example, the current distribution component 220 electrically connects one or more resistors to scale the current according to the current metric. In one example embodiment, the current distribution component 220 connects a number of resistors according to a differential voltage between a voltage metric and a reference voltage.

In another exemplary embodiment, the aggregate current supplied by the power domains includes a maximum amount of current that can be supplied by the first power domain 201A, and additional current supplied by the second power domain 202A. For example, where an amount of supplied current is 600 mA, the first power domain 201A supplies 400 mA and the second power domain 201B supplies 200 mA.

Figure 3:
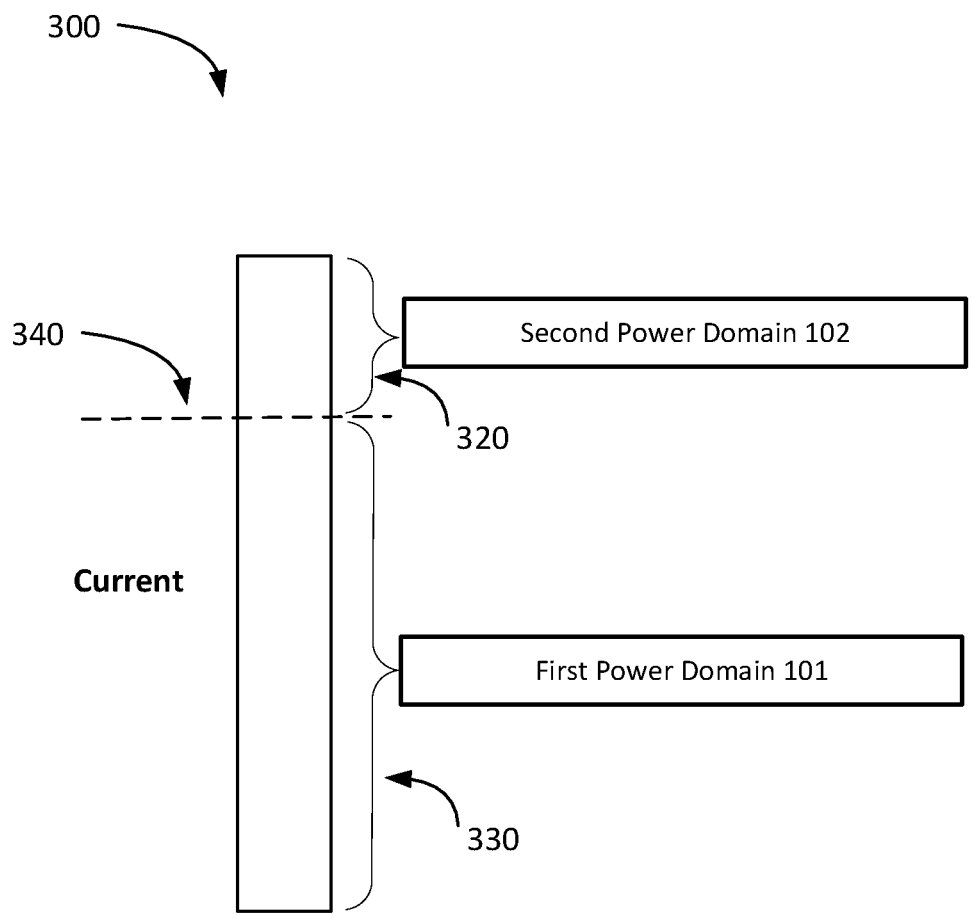
FIG. 3 is another illustration depicting one exemplary embodiment of a current range for a power distribution system.

FIG. 3 is another illustration depicting one exemplary embodiment of a current range for a power distribution system 100. In this exemplary embodiment, a first power domain 101 supplies current within a range 330 of 0 milliamps and a threshold amount 340 of milliamps. In this exemplary embodiment, the second power domain 102 supplies electrical current in a range 320 above the threshold amount 340. In this exemplary embodiment, the first power domain 101 supplies more current than the second power domain 102. In another exemplary embodiment, the first power domain 101 supplies a maximum amount of current (e.g., as much as can be supplied by the first power domain 101). In a specific example embodiment, the threshold amount 340 is 400 mA, the first power domain supplies 400 mA, and the second power domain supplies 200 mA.

In another exemplary embodiment, the current distribution component 220 draws 578 mA of current with the first power domain 101 supplying 400 mA and the second power domain 102 supplies 178 mA. In another exemplary embodiments, and as will be further described in FIG. 4, the current distribution component 220 draws 500 mA of current with the first power domain 101 and the second power domain 102 both supply a same amount of current (e.g., the first power domain 101 supplying 250 mA and the second power domain 102 supplying 250 mA).

Figure 4:
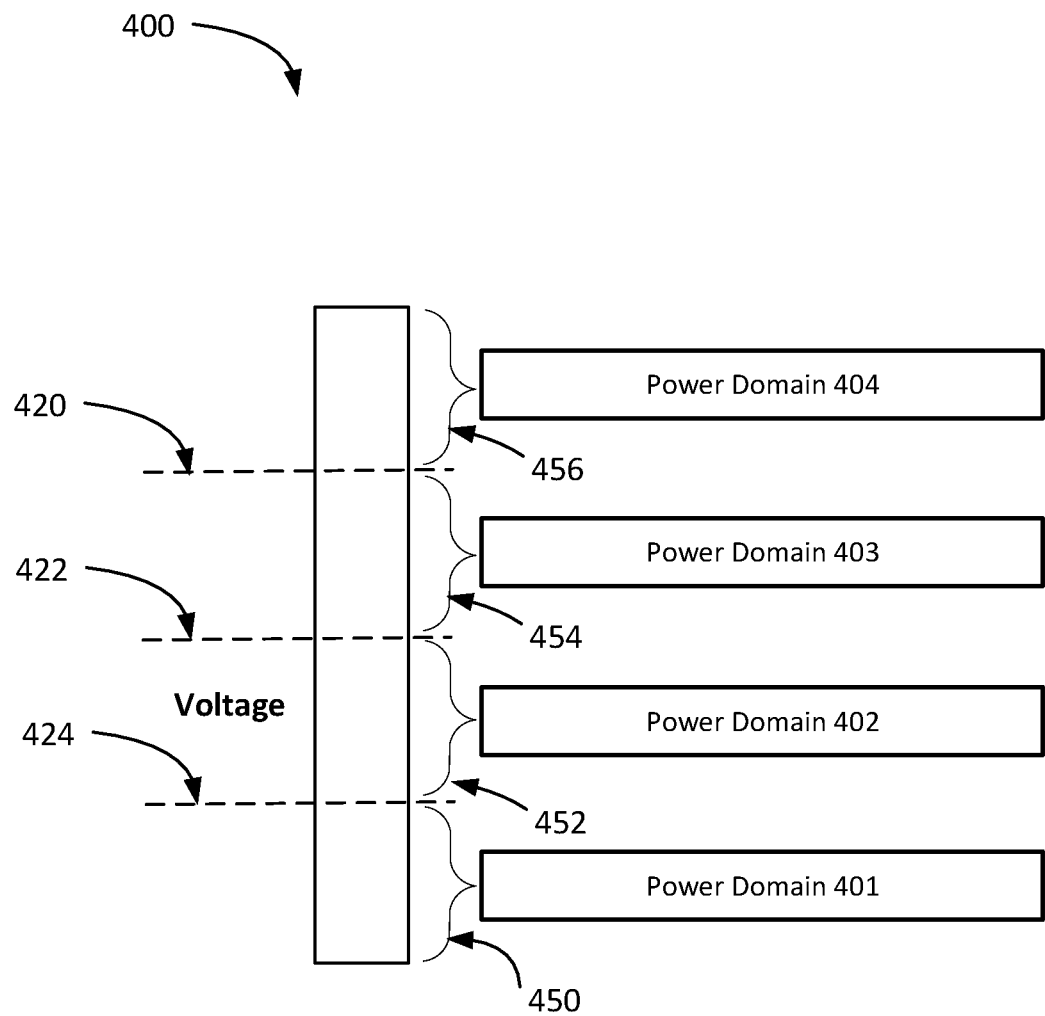
FIG. 4 is an illustration depicting another exemplary embodiment of a voltage range for a power distribution system.

FIG. 4 is an illustration depicting another exemplary embodiment of a voltage range for a power distribution system 100. In this exemplary embodiment, a first power domain 401 supplies voltage within a first voltage range 450 of voltage, a second power domain 402 supplies voltage in a second voltage range 452 of voltage, a third power domain 403 supplies voltage in a third voltage range 454 of voltage, and a fourth power domain 404 supplies voltage in a fourth voltage range 456. In this example embodiment, threshold voltage range 424, 422, and 420 define the voltage ranges 450, 452, 454, and 456.

In another example embodiment, the first voltage range 450 is between 0 and 0.9 volts, the second voltage range 452 supplies voltage between 0.9 and 1.8 volts, the third voltage range 454 supplies voltage between 1.8 and 2.7 volts, and the fourth voltage range 456 supplies voltage between 2.7 and 3.6 voltage. Of course, other voltage ranges may be used and this disclosure is not limited in this regard. In a further embodiment, the voltage ranges 450, 452, 454, and 456 are equally sized, but of course, this is not necessarily the case.

In another exemplary embodiment, a current amount provided by the first power domain 401 (e.g., at voltage 0.9 volts) is substantially similar to a current amount supplied by the second power domain 402 (e.g. at 1.8 volts). For example, the first power domain 401 may supply 300 mA of current while the second power domain 402 supplies 300 mA. As one skilled in the art may appreciate, an amount of current provided by the power domains 401, 402, 403, 404 may be adjusted according to the components used by the circuit. For example, by adjusting an amount of resistance included in a power domain circuit (e.g., the circuit 500 of FIG. 5), one skilled in the art may adjust an amount of current supplied by a certain power domain.

FIG. 5 is an illustration depicting a circuit 500 for a power domain (e.g., the first power domain 101) according to another exemplary embodiment. In one example, the power distribution system 100 supplies current to the integrated circuit 150 using current received from the power domain.

In another exemplary embodiment, the circuit includes electrical hardware components (e.g., resistors, MOSFET's, comparators, etc.). In this example embodiment, the current distribution component 120 supplies current to the integrated circuit without the use of firmware (e.g., the circuit is entire composed of hardware and no firmware devices). In another exemplary embodiment, the power distribution component 120 either connects or disconnects one or more power domains without assistance of a firmware device.

In certain embodiments, the circuit 500 supplies dynamic distribution of TMREG voltage (e.g., between 2.5 and 3.3 volts), and VCCQ 508 voltage (e.g., 1.8 volts), depending on the current consumption of the integrated circuit 150, as previously described.

As depicted in FIG. 5, VCCQ is connected to a power source at 1.8 volts and current flow through the main power MOSFET 504. Furthermore, current flows through a resistor 505 and to an amplifier.

As one skilled in the art may appreciate, an amplifier is an electronic device that may increase the power of a signal. An amplifier is a two-port electronic circuit that uses electrical power from a power supply to increase the amplitude of a signal applied to its input terminals. In this exemplary embodiment, the current from the main power MOSFET is fed into the amplifier, and the amplifier increases the power using a reference voltage source (VREF) (connected to another terminal of the amplifier.

Output of the amplifier is then connected to the main power MOSFET 504 and the sense MOSFET 506. Thus, as one skilled in the art may appreciate, as the current flow through the main power MOSFET increases, the voltage output (VSNS_CORE) of the sense MOSFET increases.

In one specific embodiment, current consumption of the integrated circuit 150 is from VCCQ 508 up to a current threshold and remaining current demand from the integrated circuit 150 is supplied from VCC (one specific example of another power domain).

In one specific exemplary embodiment, a maximum current limit from VCCQ 508 is 400 mA and a worst-case current consumption of the integrated circuit is 600 mA (400 mA for core consumption and 200 mA for input/output consumption). In this example embodiment, a sense MOSFET 506 is used along with a main power MOSFET 504 to sense when the current output of the circuit 500 reaches the current threshold. The sense MOSFET may be sized such that when the circuit 500 supplies the maximum current output (e.g., 400 mA), VSNS_CORE generates a 400 mV output value.

In this way, as the first power domain 101 supplies current at the threshold voltage and the current distribution component 220 senses the threshold voltage using the sense MOSFET, the first domain 101 main power MOSFET generates a corresponding threshold voltage.

Of course, one skilled in the art may understand additional features of the circuit 500 according to FIG. 5. In certain example, the circuit 500 additionally illustrates resistors 510, comparators 512, and other components. Thus, although not every feature of the circuit 500 is verbally described herein, one skilled in the art may appreciate additional aspects of the circuit not disclosed in this specification and this disclosure is meant to include all such aspects. Furthermore, in additional embodiments, the circuit may include additional components to adjust resistance, inductance, capacitance, or other electrical properties of the circuit without degrading the ability of the circuit to distribute power as described herein.

Figure 6A:
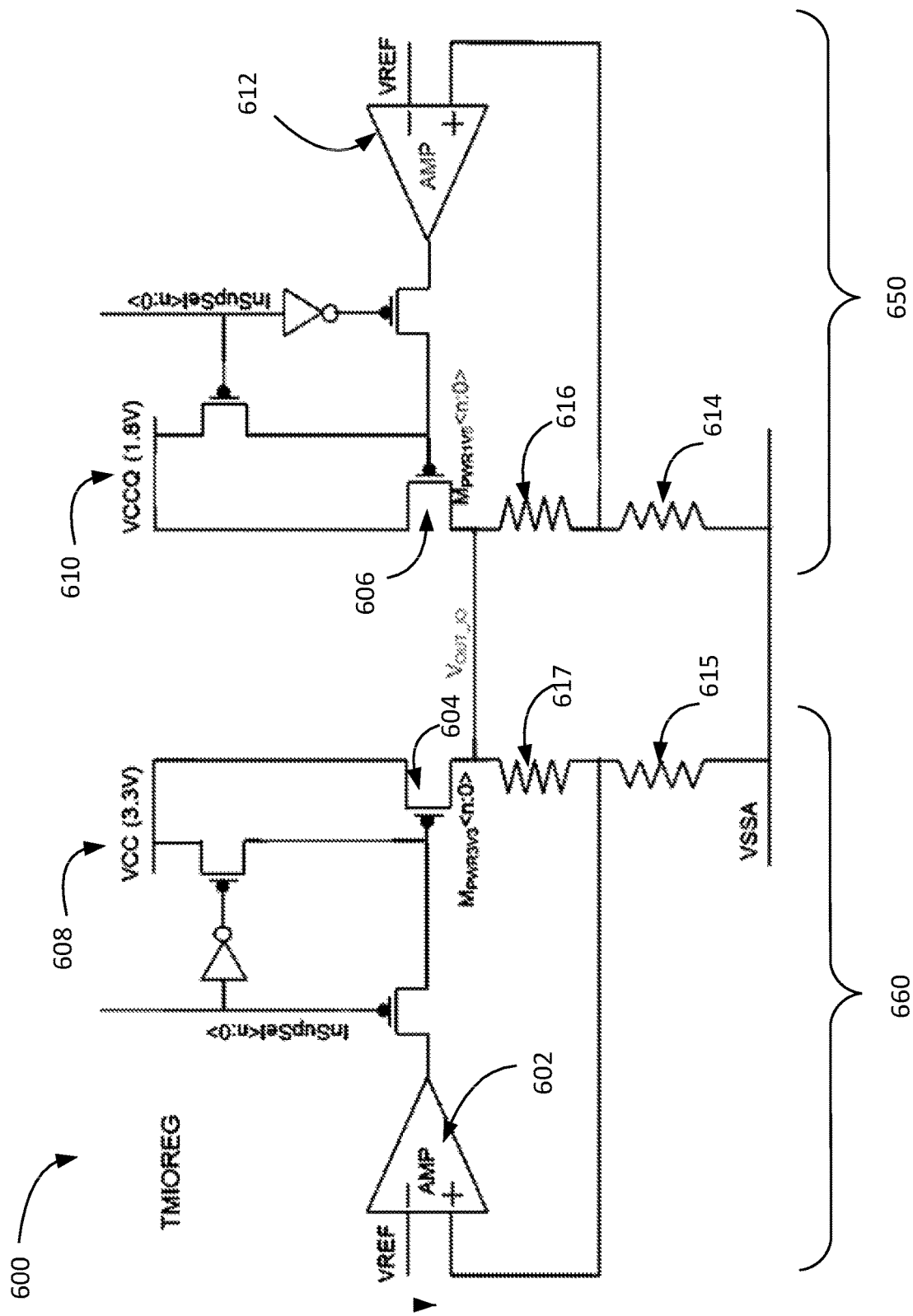
FIG. 6A is another illustration depicting another circuit for a power distribution system according to one exemplary embodiment.
Figure 7:
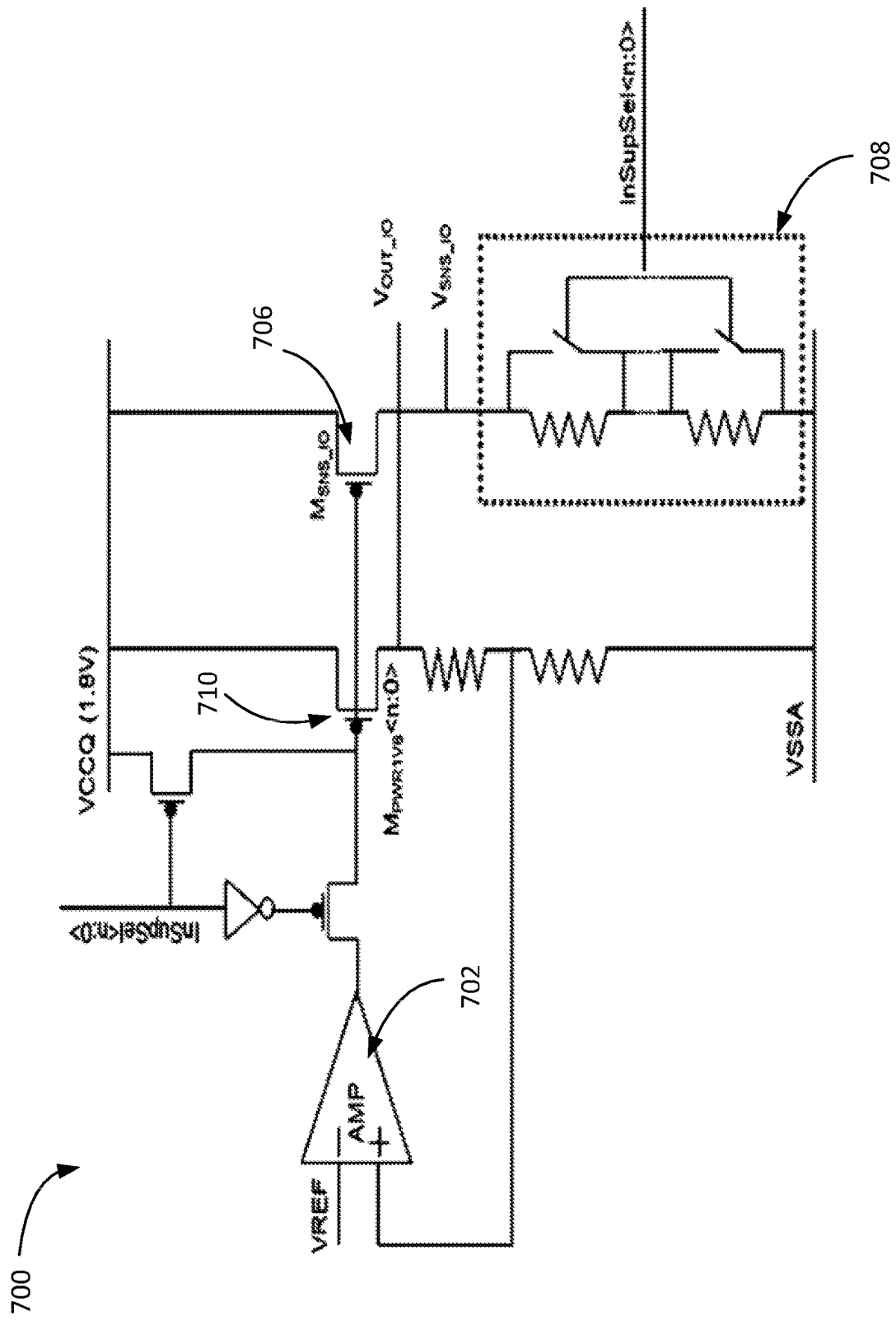
FIG. 7 is another illustration depicting a circuit for a power distribution system according to one exemplary embodiment.

FIG. 6A is another illustration depicting another circuit for a power distribution system 100 according to one exemplary embodiment. In this exemplary embodiment, the circuit 600 illustrates two power domains used by the power distribution system 100.

In one exemplary embodiment, the first power circuit 650 in the circuit 600 supplies current to memory circuitry (e.g., an integrated circuit 150) at a first voltage level (e.g., 1.8 volts), and the second power circuit 660 in the circuit 600 supplies current to the memory circuitry at a second voltage level (e.g., 3.3 volts) that is higher than the first voltage level.

In this example embodiment, current distribution circuitry is connected to the first power circuit 650 and connectable to the second power circuit 660. The current distribution circuitry senses a voltage metric by sensing a voltage output of a MOSFET. For example, the current distribution component 120 may measure the voltage output of MOSFET 606.

The current distribution component 120 may then determine whether the sensed voltage exceeds a threshold voltage. In response to the sensed voltage exceeding the threshold voltage (e.g., 1.8 volts), the current distribution component 120 electrically connects the second power domain 102.

In this exemplary embodiment, a power MOSFET 606 for the first power circuit 650 is connected to a power MOSFET 604 for a second power circuit 660. More specifically, a source for MOSFET 604 is connected to VCC 608 and the MOSFET 606 is connected to VCCQ 610. In another exemplary embodiment, the power MOSFETS 604,606 are divided into several units. Similarly, as with FIG. 5, the power circuit 650 and the power circuit 660 include amplifiers and resistors that sense voltage and/or current as previously described. Also, as with FIG. 5, one skilled in the art may understand additional features of the circuit 600 according to FIG. 6. In certain example, the circuit 600 additionally illustrates resistors 614, 615, 616, and 617, amplifiers 602,612, and other components. Thus, although not every feature of the circuit 600 is described herein, one skilled in the art may appreciate additional aspects of the circuit not disclosed in this specification and this disclosure is meant to include all such aspects.

Figure 6B:
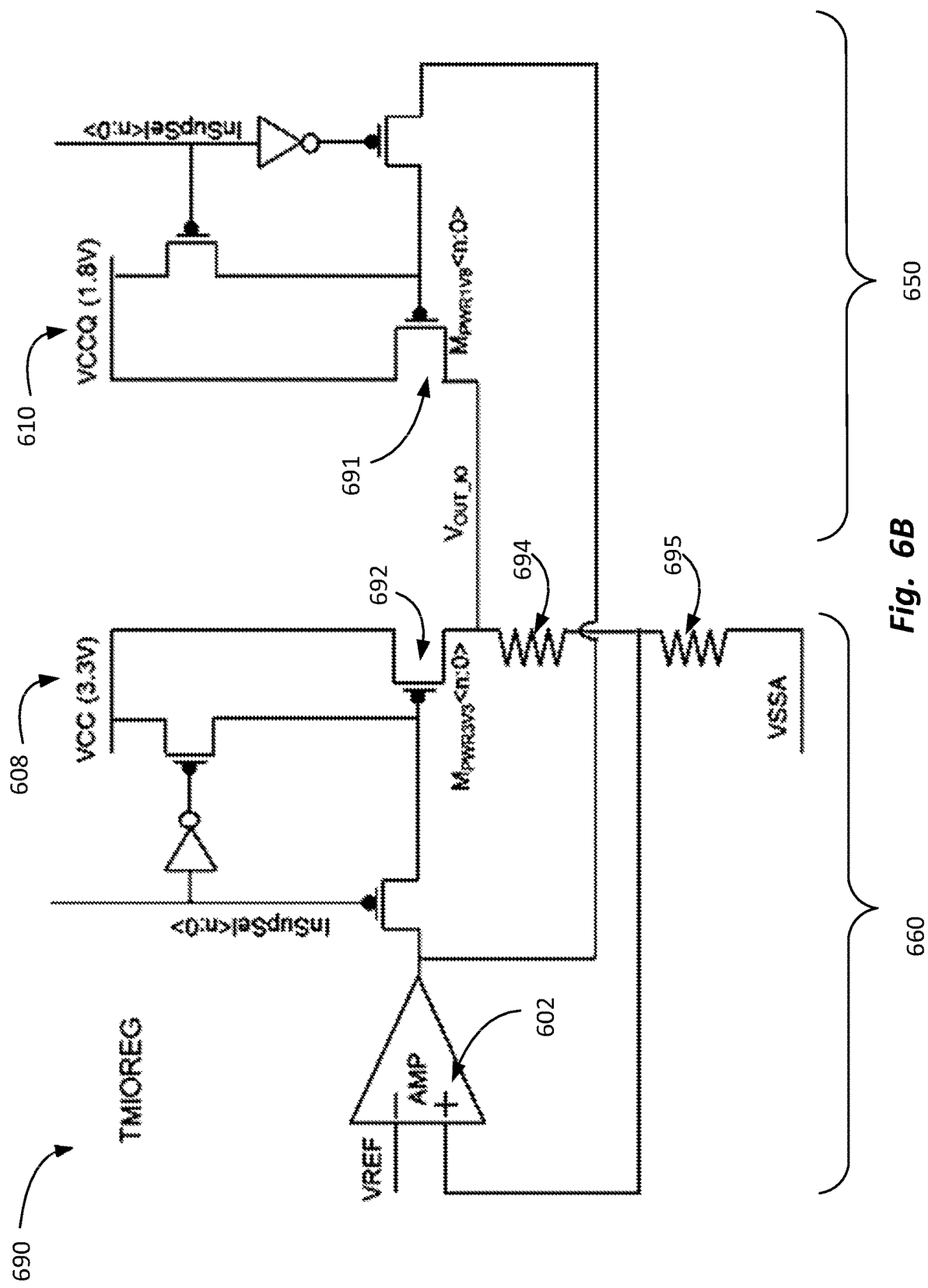
FIG. 6B is an illustration depicting a circuit for a power distribution system according to another exemplary embodiment.

FIG. 6B is an illustration depicting a circuit for a power distribution system 100 according to another exemplary embodiment. In this exemplary embodiment, the circuit 690 illustrates two power domains used by the power distribution system 100.

In one exemplary embodiment, the first power circuit 650 in the circuit 600 supplies current to memory circuitry (e.g., an integrated circuit 150) at a first voltage level (e.g., 1.8 volts), and the second power circuit 660 in the circuit 600 supplies current to the memory circuitry at a second voltage level (e.g., 3.3 volts).

In this example embodiment, current distribution circuitry is connected to the first power circuit 650 and connectable to the second power circuit 660. The current distribution circuitry senses a voltage metric by sensing a voltage output of a MOSFET 691.

The current distribution component 120 may then determine whether the sensed voltage exceeds a threshold voltage. In response to the sensed voltage exceeding the threshold voltage (e.g., 1.8 volts), the current distribution component 120 electrically connects the second power circuit 660.

In this exemplary embodiment, a power MOSFET for the first power circuit 650 is connected to a power MOSFET 692 for a second power circuit 660. More specifically, a source for MOSFET 692 is connected to VCC 608 and the MOSFET 691 is connected to VCCQ 610. In one exemplary embodiment, the power circuit 650 does not include amplifier, and the power circuit 660 includes an amplifier 602. Also depicted are resistors 694, 695. As one skilled in the art may understand additional features of the circuit 690 according to FIG. 6B. Thus, although not every feature of the circuit 690 is described herein, one skilled in the art may appreciate aspects of the circuit not disclosed in this specification and this disclosure is meant to include all such aspects.

In other exemplary embodiments, a number of amplifiers included in the circuit 690 depends on an input power supply level and process nodes. In one exemplary embodiment, if the process node is 40 nanometers or higher and a maximum operating voltage for the circuit 690 is substantially 3.6 volts (e.g., 3.3 volts plus or minus 10%). For such a process node, the circuit 690 includes a single (e.g., shared) amplifier 602 for both power circuits 650, 660. Including a single amplifier 602 in the circuit 690 saves physical space for other electrical components of the circuit 690.

In another exemplary embodiment, the process node size is 28 nanometers and a maximum operating voltage for the circuit 690 is substantially 1.98 volts (e.g., 1.8 volts plus or minus 10%). As depicted in FIG. 6A, each of the power circuits 650, 660 include a separate amplifier 602, 612. In this exemplary embodiment, including a separate amplifier 602, 612 in each of the power circuits 650, 660 increases reliability of the circuit 600.

In another exemplary embodiment, if VCC 608 and VCCQ 610 are powered by different power sources, then including a single amplifier for the circuit 690 saves physical space and allows supplying each of the power circuits 650, 660 at a same power supply level as one skilled in the art may appreciate.

FIG. 7 is another illustration depicting a circuit 700 used by a power distribution system 100 according to one exemplary embodiment. As with the circuit 500 of FIG. 5 and the circuit 600 of FIG. 6, a sense MOSFET 706 may be electrically connected to the power MOSFET 710 for another power domain. Furthermore, the circuit 700 further includes an amplifier 702 and other hardware components included in the circuit 600. Of course, the hardware components of the circuit 700 may or may not be substantially similar to those depicted in FIG. 6.

In this exemplary embodiment, in additional to the sense MOSFET 706, the circuit 700 includes a plurality of resistors 708 that may be connected according to a differential voltage between the voltage metric and a reference voltage. In one exemplary embodiment, each resistor 708 provides 1 ohm of resistance so that when the first power domain 101 receives 200 mA of current, the voltage output of the sense MOSFET 706 is 200 mV in value as one skilled in the art may appreciate.

Figure 8:
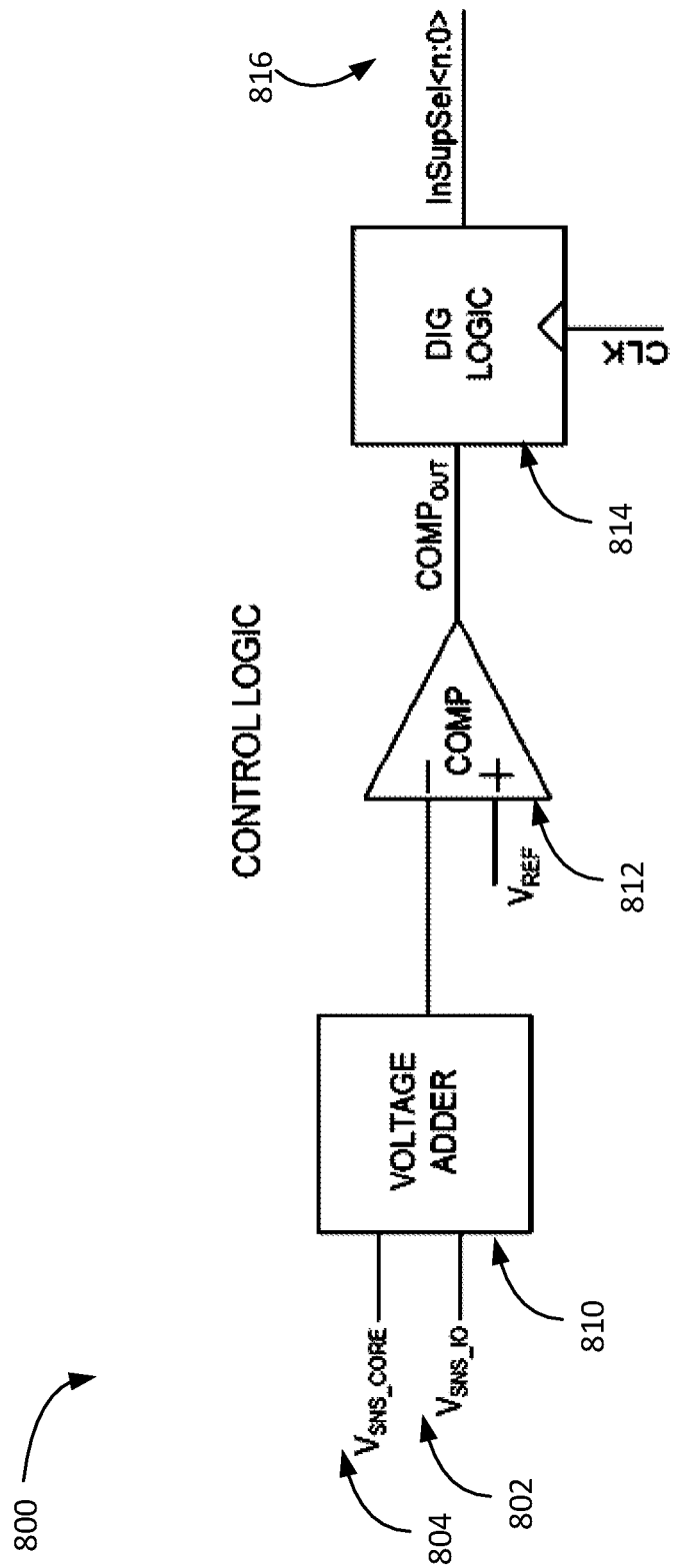
FIG. 8 is an illustration depicting an exemplary embodiment of control logic for a power distribution system.

FIG. 8 is an illustration depicting an exemplary embodiment of control logic for a power distribution system 100. In one exemplary embodiment, a voltage threshold is 400 mV. In one exemplary embodiment, the control logic 800 begins and a voltage adder 810 combines a voltage output of a sense MOSFET 802 from the first power domain 101 (e.g., VSNS_IO of FIG. 7) and a voltage output of a sense MOSFET 804 from a second power domain 102 (e.g., VSNS_CORE of FIG. 5), and determines whether the sum of voltages exceeds the threshold voltage (e.g., a reference voltage or 400 mV) with a voltage comparator 812.

In response to the output of the voltage comparator 812 being within a threshold amount from zero, the current distribution circuitry 814 electrically connects another power domain as described herein.

In another exemplary embodiment, the first power domain 101 is the only connected power domain for the integrated circuit 150. In this example, the voltage output of the main power MOSFET is 400 mV and VSNS_IO is 0 mV. Then, if COREREG current falls below 400 mA (e.g., due to a core logic frequency change), the output of the voltage comparator 812 goes high. On the next positive edge of a circuit clock for the integrated circuit, the current distribution component 120 electrically connects another power domain as described herein. In another example embodiment, the current distribution component 120 may repeatedly apply the control logic 800 until the sum of VSNS_CORE and VSNS_IO exceeds 400 mV.

Figure 9:
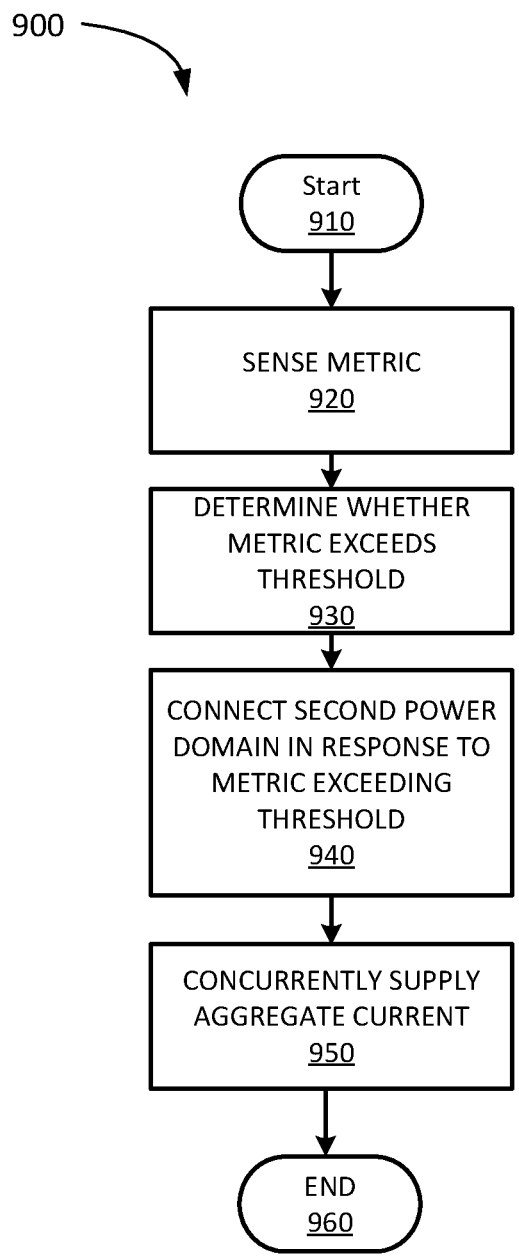
FIG. 9 is a flow chart diagram illustrating one method for power distribution according to one exemplary embodiment.

FIG. 9 is a flow chart diagram illustrating one method for power distribution according to one exemplary embodiment. The method 900 may be performed by the power distribution system 100.

As shown, the method 900 may start 910 with an operation 920 in which the power distribution system 100 senses an electrical metric of a first power domain. In one example, the metric is voltage. In another example, the metric is an amount of current drawn by the integrated circuit 150 from the first power domain 101. In one specific embodiment, the distribution system 100 senses a voltage output of a MOSFET (e.g., the MPWR_CORE MOSFET of FIG. 5).

The method 900 continues at operation 930 and the power distribution system 100 determines whether the metric exceeds a threshold. For example, the power distribution system 100 may sense a voltage output of a main power MOSFET and compare the sensed voltage with a reference voltage to determine whether the voltage exceeds the reference voltage. In another example embodiment, the power distribution system 100 senses a current from a power domain and compares the sensed current with a threshold amount of current to determine whether the sensed current exceeds the threshold current amount.

The method 900 continues at operation 940 and the power distribution system 100 electrically connects a second power domain 102, at a second voltage level that is higher than the first voltage level, after determining that the metric exceeds the threshold.

The method 900 continues at operation 950 and the power distribution system 100 concurrently supplies the first current level and additional current from the second power domain to the integrated circuit device.

The method 900 may then end 960.

In another exemplary embodiment of the method 900, the power distribution system 100 connects the second power domain by further connecting a plurality of resistors to scale the additional current supplied by the second power domain according to the metric. In one exemplary embodiment, the power distribution system 100 switches a switch to connect a resistor. In other exemplary embodiments, the power distribution system 100 connects a resistor in any other way as one skilled in the art may appreciate.

In another exemplary embodiment, an aggregate amount of current supplied by the first power domain 101 and the second power domain 102 include a maximum amount of current available from the first power domain 101. For example, in an embodiment where the first power domain 101 is capable of supplying 480 mA of current and an aggregate amount of current is 500 mA, the first domain 101 supplies 480 mA and a second power domain 102 provides 20 mA.

Figure 10:
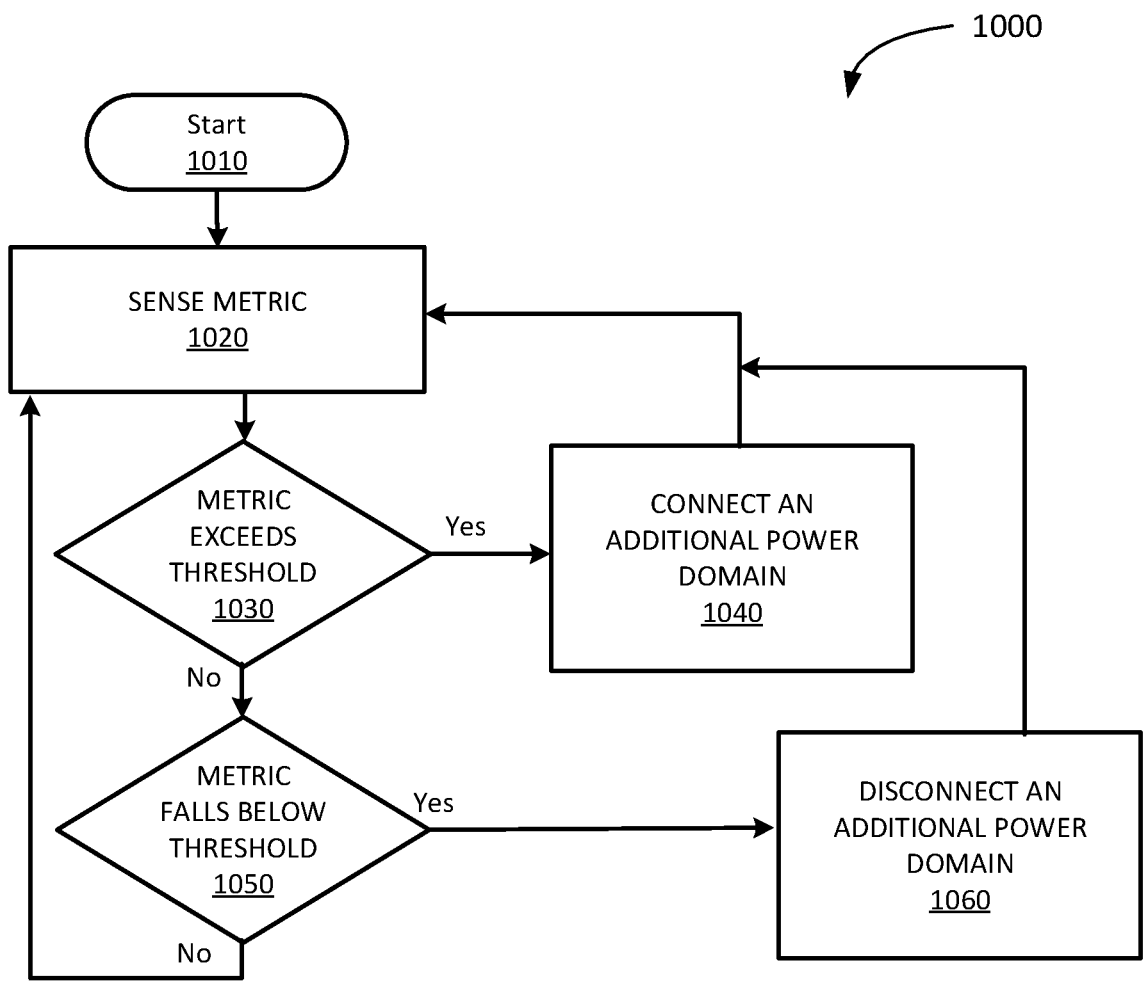
FIG. 10 is a flow chart diagram illustrating a method for power distribution according to another exemplary embodiment.

FIG. 10 is a flow chart diagram illustrating a method 1000 for power distribution according to another exemplary embodiment. The method 1000 may be performed by the power distribution system 100.

As shown, the method 1000 may start 1010 with a step 1020 in which the power distribution system 100 senses an electrical metric of a first power domain 101. In one example, the metric is voltage. In another example, the metric is an amount of current being supplied by the first power domain 101.

The method 1000 continues at operation 1030 and the power distribution system 100 determines whether the metric exceeds the threshold value. In one example embodiment, the metric is 400 mA of current and the power distribution system 100 determines that the metric exceeds 400 mA of current.

In response to the metric exceeding the threshold at operation 1030, the method 1000 continues to step 1040 and the current distribution component 220 electrically connects an additional power domain (e.g., the second power domain 102) to supply additional current to the integrated circuit 150. The method 1000 continues at step 1020 as previously described.

In response to the metric not exceeding the threshold at operation 1030, the method 1000 continues to step 1050 and the power distribution system 100 determines whether the metric falls below a threshold value. In one exemplary embodiment, the power distribution system 100 determines whether the metric falls below a threshold value by feeding the output of a main power MOSFET and a reference voltage in to a voltage adder as previously described, and determine whether an output of the voltage adder goes high. As previously described, a plurality of power domains may be associated with metric ranges (e.g., voltage and/or current ranges). Thus, the threshold values may coincide with the boundary values for each of the ranges for the power domains.

In response to the metric falling below a threshold value for a power domain, the method 1000 continues at step 1060 and the power distribution system 100 disconnects the associated power domain. The method continues at step 1020 as previously described.

In this way, and according to this method, the power distribution system, continuously adds or removes power domains according to the power requirements of the integrated circuit.

The present disclosure may be embodied in other specific forms without departing from its essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A system comprising:
a first power domain that draws power from a first power source having a first voltage level, the first power domain having an output that supplies current at a first regulated voltage level;
a second power domain that draws power from the first power source, the second power domain having an output that supplies current at a second regulated voltage level;
a third power domain that draws power from a second power source having a second voltage level that is higher than the first voltage level, the third power domain having an output that supplies current at the second regulated voltage level; and
a current distribution component that is in communication with the first power domain, the second power domain, and the third power domain and:
senses a metric comprising a sum of a first current level presently drawn from the first power domain and a second current level presently drawn from the second power domain;
based on the metric, controls the second power domain to supply a first next amount of current at the second regulated voltage level and controls the third power domain to supply a second next amount of current at the second regulated voltage level while the first power domain supplies current at the first regulated voltage level; and
maintains the sum of the first current level drawn from the first power domain and the second current level drawn from the second power domain at or below a threshold amount of current available from the first power source.

2. The system of claim 1, wherein the current distribution component senses the first current level using a sense MOSFET and a first main power MOSFET sized to generate a corresponding threshold voltage in response to the first power domain supplying current above a threshold.

3. The system of claim 1, wherein:
controlling the second power domain to provide the first next amount of current at the second regulated voltage level comprises issuing a control signal to first power MOSFETs in the second power domain to supply the first next amount of current; and
controlling the third power domain to provide the second next amount of current at the second regulated voltage level comprises issuing the control signal to second power MOSFETs in the third power domain to supply the second next amount of current.

4. The system of claim 1, further comprising:
a sense MOSFET in the second power domain; and
a plurality of resistors in the second power domain, wherein the current distribution component is further configured to select a number of the resistors to connect to the sense MOSFET to scale current from the sense MOSFET according to the metric to sense the second current level.

5. A method comprising:
sensing a first current level drawn by a first integrated circuit from a first power domain connected to a first power source having a first voltage level;
sensing a second current level drawn by a second integrated circuit from a second power domain connected to the first power source;
determining that a sum of the first current level and the second current level meets a threshold current associated with the first power source;
electrically connecting a third power domain to supply additional current to the second integrated circuit in response to determining that the sum of the first current level and the second current level meets the threshold current, the third power domain connected to a second power source having a second voltage level that is higher than the first voltage level; and
concurrently supplying the additional current from the third power domain to the second integrated circuit while supplying the threshold current as the sum of the current from the first power domain to the first integrated circuit and the current from the second power domain to the second integrated circuit.

6. The system of claim 1, wherein:
the first power domain supplies current at the first regulated voltage level to a first integrated circuit;
the second power domain supplies current at the second regulated voltage level to a second integrated circuit; and
the third power domain supplies current at the second regulated voltage level to the second integrated circuit.

7. The method of claim 5, wherein electrically connecting the third power domain to the second integrated circuit comprises issuing a control signal to power MOSFETs in the third power domain to supply the additional current.

8. The method of claim 5, wherein sensing the first current level comprises sensing the first current level using a sense MOSFET and a first main power MOSFET sized to generate a corresponding threshold voltage in response to the first power domain supplying current above the threshold current associated with the first power source.

9. The method of claim 5, wherein sensing the second current level drawn by the second integrated circuit from the second power domain comprises selecting a number of resistors of plurality of resistors to scale a current in a sense MOSFET in the second power domain.

10. The method of claim 5, wherein an aggregate current level received by the first integrated circuit from the first power domain and by the second integrated circuit from the second power domain when the sum of the first current level and the second current level meets the threshold current comprises a maximum amount of current available from the first power source.

11. A non-volatile memory device comprising:
a first power domain that draws power from a first power source having a first voltage level, the first power domain supplies current to an integrated circuit at a regulated voltage level, the first power domain comprising a first plurality of power MOSFETs configured to provide current from the first power source to the integrated circuit;
a second power domain that draws power from a second power source having a second voltage level that is higher than the first voltage level, the second power domain supplies current to the integrated circuit at the regulated voltage level, the second power domain comprising a second plurality of power MOSFETs configured to provide current from the second power source to the integrated circuit; and
control logic coupled to the first power domain and to the second power domain, wherein the control logic is configured to:
sense a current level drawn from the first power source during a present clock cycle;
based on the current level drawn from the first power source during the present clock cycle, select a first number of the first plurality of power MOSFETs and a second number of the second plurality of power MOSFETs to provide current to the integrated circuit during a next clock cycle that follows the present clock cycle;

maintain the current level drawn from the first power source at or below a threshold current available from the first power source; and issue a control signal to the first power domain and to the second power domain during the next clock cycle to select the first number of the first plurality of power MOSFETs and the second number of the second plurality of power MOSFETs to provide current to the integrated circuit during the next clock cycle.

12. The non-volatile memory device of claim 11, wherein the first power domain and the second power domain supply current to a first integrated circuit, and further comprising:

a third power domain that draws power from the first power source, the first power domain supplies current to a second integrated circuit at second regulated voltage level.

13. The non-volatile memory device of claim 12, wherein the control logic is configured to determine the current level drawn from the first power source during the present clock cycle based on a sum of the current drawn by the first integrated circuit from the first power domain and the second power domain.

14. The non-volatile memory device of claim 11, wherein the control logic comprises digital logic having:

a first input configured to receive a signal based on the current level drawn from the first power source during the present clock cycle;

a second input configured to receive a clock signal that defines the clock cycle; and an output configured to output an updated version of the control signal each cycle of the clock signal.

* * * * *